United States Patent [19]

Adachi

[11] Patent Number: 4,618,834
[45] Date of Patent: Oct. 21, 1986

[54] VARIABLE CHARACTERISTICS AMPLIFIER CIRCUIT

[75] Inventor: Hiroo Adachi, Saitama, Japan

[73] Assignee: Pioneer Electronic Corporation, Tokyo, Japan

[21] Appl. No.: 753,468

[22] Filed: Jul. 10, 1985

[30] Foreign Application Priority Data

Jul. 10, 1984 [JP] Japan .......................... 59-104238[U]

[51] Int. Cl.⁴ ............................................ H03G 3/30
[52] U.S. Cl. .................................. 330/284; 360/74.4
[58] Field of Search ............... 330/144, 145, 284, 305; 360/74.4

[56] References Cited

U.S. PATENT DOCUMENTS 4,178,482 12/1979 Ouellette ......................... 330/284 X
4,220,931 9/1980 Hines et al. ......................... 330/284

Primary Examiner—James B. Mullins
Attorney, Agent, or Firm—Sughrue, Mion, Zinn, Macpeak and Seas

[57] ABSTRACT

A variable characteristics amplifier circuit such as may be used in an inter-music interval detecting circuit for a tape deck, record player, or the like. First and second transistors are connected in an emitter follower configuration with an input signal being applied to the base of the first transistor. One of the emitter or collector of the second transistor is connected through a series circuit of a capacitor and resistor to an inverting input terminal of an operational amplifier, and a feedback circuit is provided between this input terminal and the output of the operational amplifier. A capacitor is coupled between the selected one of the emitter and collector of the second transistor and its base.

8 Claims, 3 Drawing Figures

VARIABLE CHARACTERISTICS AMPLIFIER CIRCUIT

BACKGROUND OF THE INVENTION

The present invention relates to a variable characteristics amplifier circuit, and more particularly to a variable characteristics amplifier circuit used in an inter-music interval detecting device for a tape deck or the like.

Recently, tape decks have been developed in which blank intervals between music intervals recorded on a tape are detected for the purpose of controlling special reproducing operations such as repeating selections, scanning, skipping blank portions or the like in the playback mode, and reviewing, jumping, selecting music, or the like in the fast forward or rewinding mode. In the fast forward and rewinding modes, the transport speed of the tape is generally higher than in the playback mode, and the frequency band of the read-out audio signal is higher than in the playback mode by an amount corresponding to the ratio of tape speeds in the two modes. Also, the output level of the signal from the reproducing head is at a generally higher level than in the playback mode. Therefore, in the inter-music interval detecting device, it is necessary to employ different gain levels and different cut-off frequencies for the output signal from the reproducing head in the two modes in order to prevent errors due to noise in detecting the intermusic intervals. Accordingly, there is provided a variable characteristics amplifier circuit to vary the gain and frequency characteristics of the reproduced signal in accordance with the operating mode.

FIG. 1 shows an example of a conventional variable characteristics amplifier circuit used for an inter-music interval detecting device in a tape deck. In this drawing, left-channel (L) and right channel (R) audio signals are reproduced from a tape by a reproducing head (not shown) and then applied to succeeding-stage amplifiers (not shown) through preceding-stage amplifiers $1_L$ and $1_R$ coupling capacitors $2_L$ and $1_R$, and buffer amplifiers $3_L$ and $3_R$, respectively. The respective output terminals of the preceding-stage amplifiers $1_L$ and $1_R$ are connected to a variable-characteristics amplifier circuit 26 through resistors $5_L$ and $5_R$, respectively. Each of the resistors $5_L$ and $5_R$ has a comparatively large resistance value so as to prevent loss of separation between the L and R signals. The operation of the tape deck is controlled by a microcomputer 4 having output ports $O_1$ to $O_4$. The level of the signal at the output port $O_4$ is low for the playback mode and high for the fast forward and rewinding modes.

An input section of the variable characteristics amplifier circuit 26 is constituted by an emitter-follower circuit 25 composed of a resistor 6 and a transistor 7. The emitter of the transistor 7, constituting an output terminal of the emitter follower circuit 25, is connected to an anode of a diode 10 through a capacitor 8 and a resistor 9. A voltage $V_{DD}$ is supplied to the anode of the diode 10 through resistors 11 and 12 connected in series. The line connecting the resistors 11 and 12 is grounded through the collector-emitter circuit of a transistor 13. The base of the transistor 13 is connected to the output port $O_4$ of the microcomputer 4 through a resistor 14. A capacitor 15 is connected in parallel with the diode 10, the cathode of which is grounded through a resistor 16. The cathode of the diode 10 is connected also to an inverting input terminal of an operational amplifier 18 through a capacitor 17. A resistor 19 and a capacitor 20 are connected in parallel with each other between the input and output terminals of the operational amplifier 18 so as to constitute an inverting amplifier circuit. A Schmitt-trigger amplifier 21 is connected to an output terminal of the operational amplifier 18, that is, an output terminal of the variable characteristics amplifier circuit 26, and an output terminal of the Schmitt-trigger amplifier 21 is connected to an input port $I_1$ of the microcomputer 4 through an inverter 24 constitutedd by a transistor 22 and a resistor 23.

In this arrangement, the respective audio signals produced by the preceding-stage amplifiers $1_L$ and $1_R$ are summed through the resistors $5_L$ and $5_R$, and the summed signal is applied in the form of a monoaural signal from the emitter of the transistor 7 of the emitter follower 25 to the anode of the diode 10 through the capacitor 8 and the resistor 9.

Assuming now that the tape deck is in the playback mode, the level of the signal at the output port $O_4$ of the microcomputer 4 is low, and thus the transistor 13 is off. Thus, the voltage $V_{DD}$ is applied to the series circuit constituted by the resistors 11 and 12, the diode 10, and the resistor 16, and hence current flows in the series circuit, causing the diode 10 to be in the on state.

Thus, an output audio signal of the emitter follower circuit 25 is applied to the operational amplifier 18 through the capacitor 8, the resistor 9, the diode 10, and the capacitor 17 without passing through the capacitor 15. The operational amplifier 18 inverts and amplifies the input signal applied thereto. If the sum $(R_{11}+R_{12})$ of the resistance values $R_{11}$ and $R_{12}$ of the resistors 11 and 12 and the resistance value $R_{16}$ of the resistor 16 are sufficiently larger than the resistance value $R_9$ of the resistor 9, and if the output impedance of the emitter follower circuit 25 is sufficiently smaller than the resistance value $R_9$ of the resistor 9, the gain $G_V$ in the intermediate frequency band of the operational amplifier 18 will be $G_V \cong 20 \log R_{19}/R_9$, where $R_{19}$ represents the resistance value of the resistor 19. A frequency $f_H$ which is 3 dB below the maximum value in the high frequency band is expressed by $f_H \cong \frac{1}{2}\pi C_{20}R_{19}$, where $C_{20}$ represents the capacitance value of the capacitor 20. The cut-off frequency $f_L$ in the low frequency band can be expressed by $f_L \cong \frac{1}{2}\pi C_{17}R_9$ if the capacitance value $C_{17}$ of the capacitor 17 is sufficiently smaller than the capacitance value $C_8$ of the capacitor 8.

On the other hand, when the tape deck is in the fast forward or rewinding mode, the level of the signal at the output port $O_4$ of the microcomputer 4 is high so that the transistor 13 is turned on. Upon turning the transistor 13 on, the line between the resistors 11 and 12 substantially becomes ground potential so that the diode 10 is turned off, that is, no bias voltage is applied to the diode 10. Accordingly, the output audio signal from the emitter follower circuit 25 is applied to the operational amplifier 18 through the capacitor 8, the resistor 9, and the capacitors 15 and 17.

In this case, if the operational amplifier 18 were ideal, the gain $G_V$ in the intermediate frequency band would be $G_V \cong 20 \log R_{19}/R_9$, as in the playback mode. However, the operational amplifier 18 cannot in actuality be regarded as ideal, and further if the resistance value $R_{12}$ of the resistor 12 is small, the input signal level is attenuated and therefore the gain imparted by the operational amplifier 18 is reduced. In this case, the cut-off frequency $f_L$ in the low frequency band becomes $f_L \cong \frac{1}{2}\pi C_{15}(R_9//R_{12})$, where $C_{15}$ represents the capacitance value of the capacitor 15 ($C_{15} << C_{17}$) and $R_9//R_{12}$ the resistance of the parallel combination of the resistors $R_9$ and $R_{12}(=R_9R_{12}/(R_9+R_{12}))$. Therefore, in the fast forward mode as well as in the rewinding mode, the gain in the intermediate frequency band is reduced and the cut-off frequency in the low frequency band is made high in comparison with the playback mode.

The output signal of the operational amplifier 18 is compared with a predetermined level in the Schmitt-trigger trigger amplifier 21. When the output signal of the operational amplifier 18 is not smaller than the predetermined level, the output level of the Schmitt-trigger amplifier 21 is high, while when it is below the predetermined level, the output level of the Schmitt-trigger amplifier 21 is inverted by the inverter 24 and applied to the input port $I_1$ of the microcomputer 4. When the level at the imput port $I_1$ is low, the microcomputer 4 determines that no reproduced signal is then present, that is, that an inter-music interval is indicated.

However, in such a conventional variable characteristics amplifier circuit, there are disadvantages in that it is difficult to determine the circuit constants because the on resistance of the diode 10 cannot be actually disregarded. Moreover, variations in the gain of the operational amplifier 18 result in variations in the gain in the intermediate frequency band because the operational amplifier 18 does not act as an ideal amplifier when the diode 10 is turned off.

SUMMARY OF THE INVENTION

An object of the present invention is thus to provide a variable characteristics amplifier circuit in which circuit constants can be easily set and variations in gain in the intermediate frequency band are suppressed.

According to one aspect of the present invention, a variable characteristics amplifier circuit is provided which comprises an active element having a pair of controlled terminals and a single controlling terminal and which is conductive in a forwardly biased state, an amplifier circuit having a feedback circuit between input and output terminals thereof and which is connected to a selected one of the controlled terminal of the active element, means for reversely biasing the active element in accordance with a characteristics varying command, and an impedance element connected between the one controlled terminal and controlling terminal.

Other objects, features, and advantages of the invention will be aparent from the following description takin in conjunction with accompanying drawings.

DESCRIPTION OF THE PREFERRED EMBODIMENT

Figure 1:
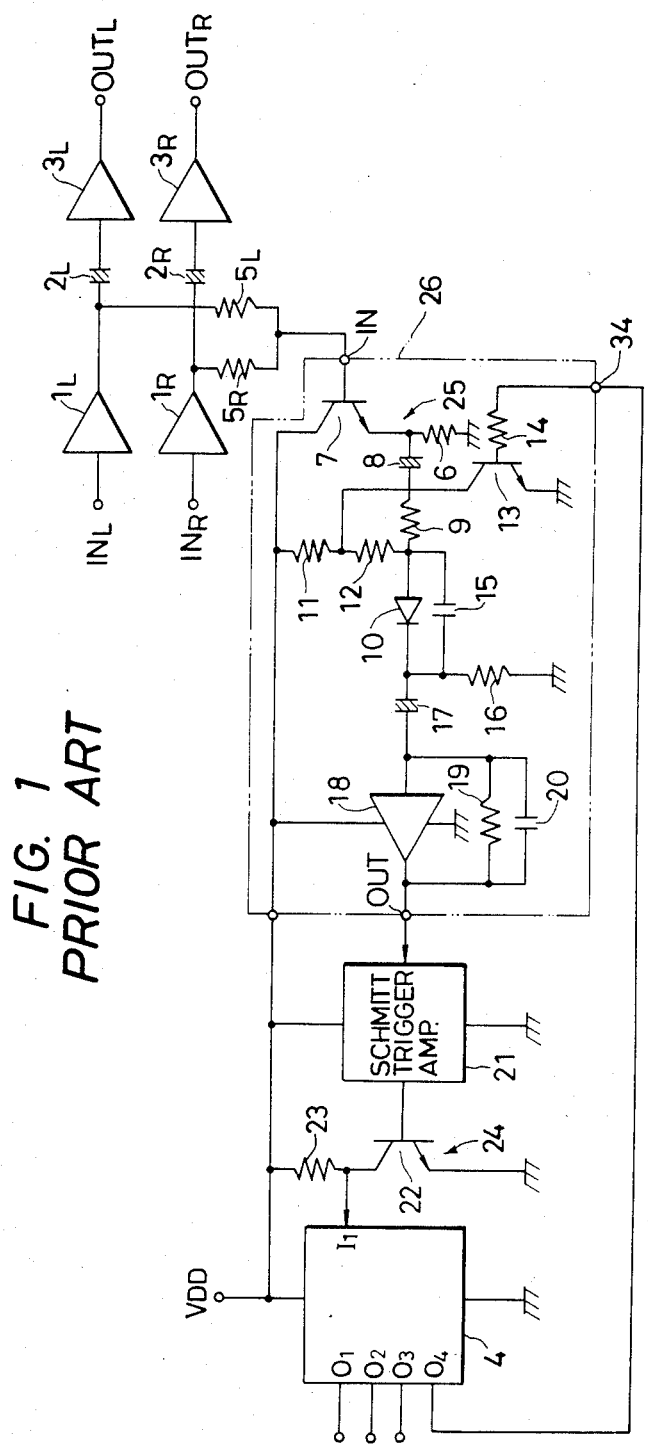
FIG. 1 is a circuit diagram showing an intermusic interval detecting device using a conventional variable characteristics amplifier circuit.

Referring to the drawings, preferred embodiments of the present invention will be described hereunder.

Figure 2:
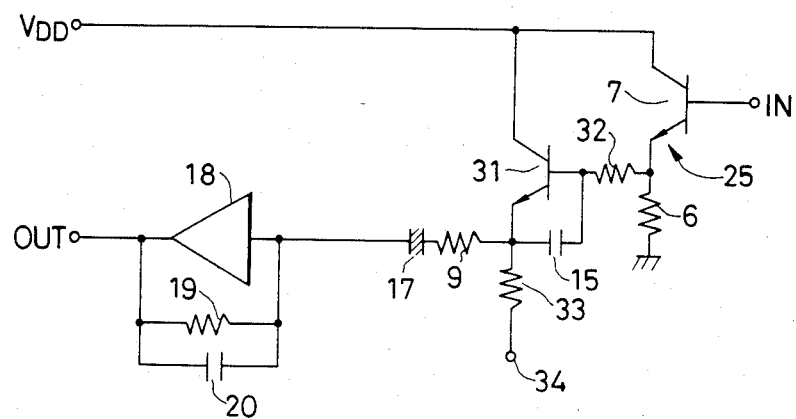
FIG. 2 is a circuit diagram showing an embodiment of the present invention.

FIG. 2 shows a preferred embodiment of a variable characteristics amplifier circuit of the invention. In this drawing, the same elements as those of FIG. 1 are correspondingly referenced.

In this embodiment, there are additionally provided a transistor 31, and resistors 32 and 33. The base of the transistor 31 is connected to the emitter of a transistor 7 through the resistor 32, and the emitter of the transistor 31 is connected to an inverting input terminal of an operational amplifier 18 through a series connection of a resistor 9 and a capacitor 17, and is further connected to a controlling terminal 34 through a resistor 33. A capacitor 15 is connected between the base and the emitter of the transistor 31, and a voltage $V_{DD}$ is supplied to the collector of the same transistor. The other arrangements of the variable characteristics amplifier circuit of this embodiment are the same as in the case of FIG. 1. The controlling terminal 34 is connected, for example, to the output port $O_4$ of the microcomputer 4 in FIG. 1.

In the thus-arranged variable characteristics amplifier circuit according to the present invention, the transistor 31 and the resistor 33 operate as an emitter follower circuit when the controlling terminal 34 is at a low level. Therefore, the audio signal applied to an input terminal $I_{N1}$ is transferred to the operational amplifier 18 through the emitter follower circuit 25, an emitter follower circuit composed of the resistor 32, the transistor 31 and the resistor 33, the resistor 9, and the capacitor 17. Therefore, in this case, the gain $G_V$ in the intermediate frequency band is $G_V=20 \log R_{19}/R_9$, that is, the same as in the conventional circuit, and the cut-off frequency $f_L$ in the low frequency band is $f_L=\frac{1}{2}\pi C_{17}R_9$, also the same as in the conventional circuit. The influence of the resistor 32 and the capacitor 15 on the gain $G_V$ and the cut-off frequency $f_L$ in the low frequency band can be disregarded if the impedance of the resistor 32 and the capacitor 31 operates as an emitter follower. Also, the resistance value of the resistor 33 can be disregarded by making the resistance value of the resistor 33 as small as possible to lower the output impedance of the transistor 31.

On the other hand, when the controlling terminal 34 is at a high level (equal to the voltage $V_{DD}$), the transistor 31 is turned off because the emitter voltage of the transistor 31 is substantially equal to the voltage $V_{DD}$. Upon turning the transistor 31 off, the output signal of the emitter follower circuit 25 is applied to the operational amplifier 18 through the resistor 32, the capacitor 15, the resistor 9, and the capacitor 17. Therefore, if the resistance value $R_{33}$ of the resistor 33 is sufficiently larger than the resistance value $R_{32}$ of the resistor 32, the gain $G_V$ in the intermediate frequency band will be $G_V=20 \log R_{19}/(R_9+R_{32})$, and if the capacitance value $C_{17}$ of the capacitor 17 is sufficiently larger than the capacitance value $C_{15}$ of the capacitor 15, the cut-off frequency $f_L$ in the low frequency band will be $f_L=\frac{1}{2}\pi C_{15}(R_9+R_{32})$. Therefore, compared with the case in which the controlling terminal 34 is at a low level, the gain $G_V$ is lower and the cut-off frequency $f_L$ in the low frequency band higher.

Figure 3:
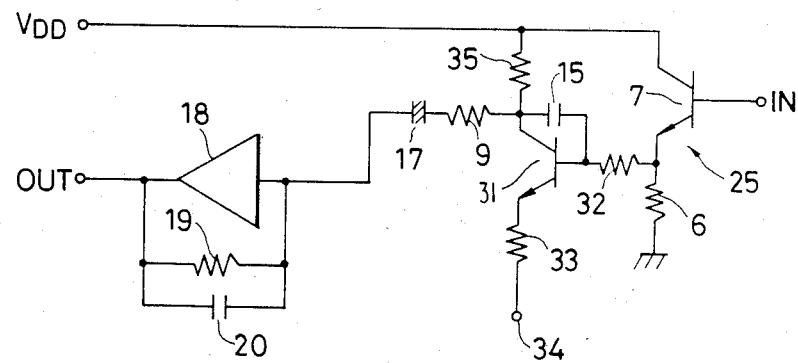
FIG. 3 is a circuit diagram showing another embodiment of the present invention.

FIG. 3 shows another embodiment of the present invention. In this drawing, a capacitor 15 is connected between the collector and the base of a transistor 31, and the collector of the transistor 31 is connected to an inverting input terminal of an operational amplifier 18 through a resistor 9 and a capacitor 17. Further, a voltage $V_{DD}$ is supplied to the collector of the transistor 31 through a resistor 35, and the output signal of an emitter follower circuit 25 is applied to a buffer amplifier constituted by the transistor 31 and the resistors 33 and 35.

Thus, in the variable characteristics amplifier circuit of the present invention, the circuit constants of the amplifier circuit can be readily established because a low impedance output of a preceding stage active element is applied to the amplifier circuit when the amplifier circuit operates as a buffer amplifier. In the case where the active element is reversely biased, a signal is applied to the amplifier circuit through an impedance element such as a capacitor so as to decrease the input resistance of the amplifier circuit and thus lower the gain of the amplifier circuit. Therefore, the variations in net gain of the operational amplifier can be disregarded so that the variations in gain of the overall circuit are more completely suppressed than in the conventional circuit. Furthermore, the number of parts is reduced compared with the conventional circuit so that the cost of the circuit is lower.

What I claim:

1. A variable characteristics amplifier circuit comprising:
   an active element provided with a pair of controlled terminals and a single controlling terminal and conductive in a forwardly biased state;
   an amplifier circuit having a feedback circuit coupled between input and output terminals thereof, said input terminal being connected to a selected one of said controlled terminals of said active element;
   means for selectively reversely biasing said active element in accordance with a characteristics varying command; and
   an impedance element connected between said one controlled terminal and said controlling terminal.

2. The variable characteristics amplifier circuit of claim 1, wherein said active element comprises a bipolar transistor.

3. The variable characteristics amplifier circuit of claim 2, wherein said impedance element comprises a capacitor.

4. The variable characteristics amplifier circuit of claim 1, further comprising a series circuit of a capacitor and a resistor for connecting said input terminal of said amplifier to said one controlled terminal of said active element.

5. A variable characteristics amplifier circuit comprising: first and second transistors connected to an emitter follower circuit with an emitter of said first transistor driving a base of said second transistor, an input signal being applied to a base of said first transistor; a capacitor coupled between a base of said second transistor and an emitter of said second transistor; an operational amplifier having a feedback circuit comprising a parallel circuit of a capacitor and a resistor coupled between an inverting input terminal and an output terminal of said operational amplifier; and a series circuit of a capacitor and a resistor coupled between said inverting input terminal of said operational amplifier and said emitter of said second transistor.

6. The variable characteristics amplifier circuit of claim 5, wherein said collector of said second transistor is connected directly to a voltage source.

7. A variable characteristics amplifier circuit comprising: first and second transistors connected to an emitter follower circuit with an emitter of said first transistor driving a base of said second transistor, an input signal being applied to a base of said first transistor; a capacitor coupled between a base of said second transistor and a collector of said second transistor; an operational amplifier having a feedback circuit comprising a parallel circuit of a capacitor and a resistor coupled between an inverting input terminal and an output terminal of said operational amplifier; and a series circuit of a capacitor and a resistor coupled between said inverting input terminal of said operational amplifier and said collector of said second transistor.

8. The variable characteristics amplifier circuit of claim 7, further comprising a resistor coupled between said collector and a voltage source.

* * * * *